US007633979B2

(12) United States Patent
Luo et al.

(10) Patent No.: US 7,633,979 B2
(45) Date of Patent: Dec. 15, 2009

(54) METHOD AND APPARATUS FOR PRODUCING UV LASER FROM ALL-SOLID-STATE SYSTEM

(75) Inventors: Ningyi Luo, Fremont, CA (US); Sheng-Bai Zhu, Fremont, CA (US)

(73) Assignee: Pavilion Integration Corporation

( * ) Notice: Subject to any disclaimer, the term of this patent is extended or adjusted under 35 U.S.C. 154(b) by 0 days.

(21) Appl. No.: 12/029,919

(22) Filed: Feb. 12, 2008

(65) Prior Publication Data

US 2009/0201952 A1 Aug. 13, 2009

(51) Int. Cl.
*H01S 3/10* (2006.01)
(52) U.S. Cl. .............................. 372/21; 372/22; 372/69
(58) Field of Classification Search .................. 372/21, 372/22
See application file for complete search history.

(56) References Cited

U.S. PATENT DOCUMENTS

| | | | |
|---|---|---|---|
| 6,031,854 A | 2/2000 | Ming | |
| 6,088,379 A | 7/2000 | Owa et al. | |
| 6,249,371 B1 | 6/2001 | Masuda et al. | |
| 6,373,869 B1 | 4/2002 | Jacob | |
| 6,381,255 B1 | 4/2002 | Van Saarloos et al. | |
| 6,700,906 B2 | 3/2004 | Hackel et al. | |
| 2005/0094682 A1 | 5/2005 | Tulloch et al. | |
| 2006/0215714 A1* | 9/2006 | Luo et al. | 372/29.02 |
| 2007/0177638 A1 | 8/2007 | Seelert et al. | |
| 2008/0037604 A1* | 2/2008 | Savage-Leuchs | 372/44.01 |

FOREIGN PATENT DOCUMENTS

WO  WO/2006/087650  7/2006

OTHER PUBLICATIONS

"All-solid-state, high-power, deep-UV laser system based on cascaded sum-frequency mixing in CsLiB6O10 crystals", Sakuma et al. Applied Optics, vol. 39, No. 30, 5505 (2000).
"Generation of all-solid-state, high-power continuous-wave 213-nm light based on sum-frequency mixing in CsLiB6O10", Sakuma et al. Optics Letters, vol. 29, 1096 (2004).
"An all solid-state UV source based on a frequency quadrupled, passively Q-switched 946 nm laser", Johansson et al. Optics Express, vol. 15, No. 2, 449 (2007).

* cited by examiner

*Primary Examiner*—Dung T Nguyen

(57) ABSTRACT

An all-solid-state laser system produces coherent DUV radiation through a third or fourth harmonic generation. The fundamental wavelength is generated by a slave laser optically pumped by one or more light source(s) of high density array(s) and is stabilized by injecting optical seeds whose wavelength is rapidly swept to cover the fundamental wavelength. The pump effects are enhanced by a pump chamber that recycles unabsorbed pump light. The present invention enables DUV pulses with a width shorter than 1 ns and a repetition rate higher than 100 kHz. The output DUV wavelength is adjustable by selecting an appropriate seeder.

16 Claims, 16 Drawing Sheets

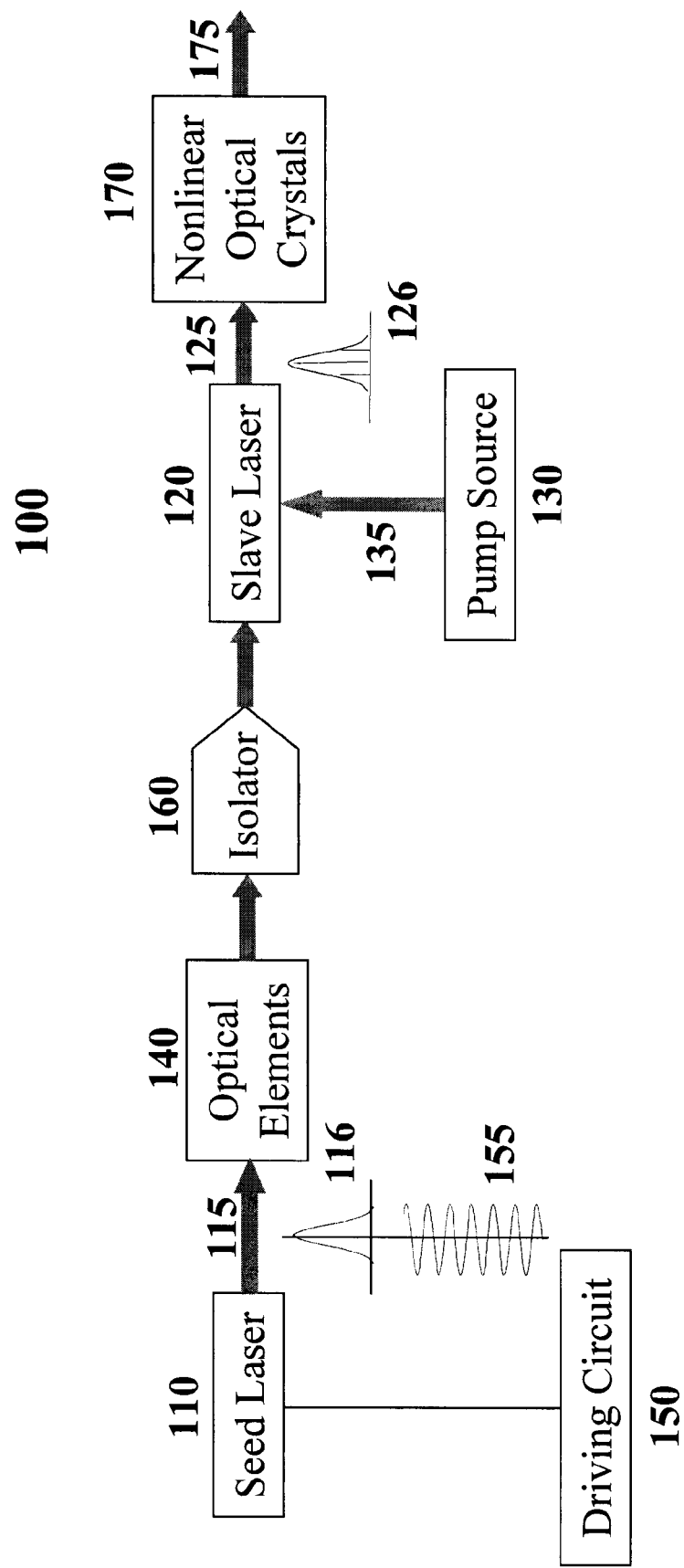

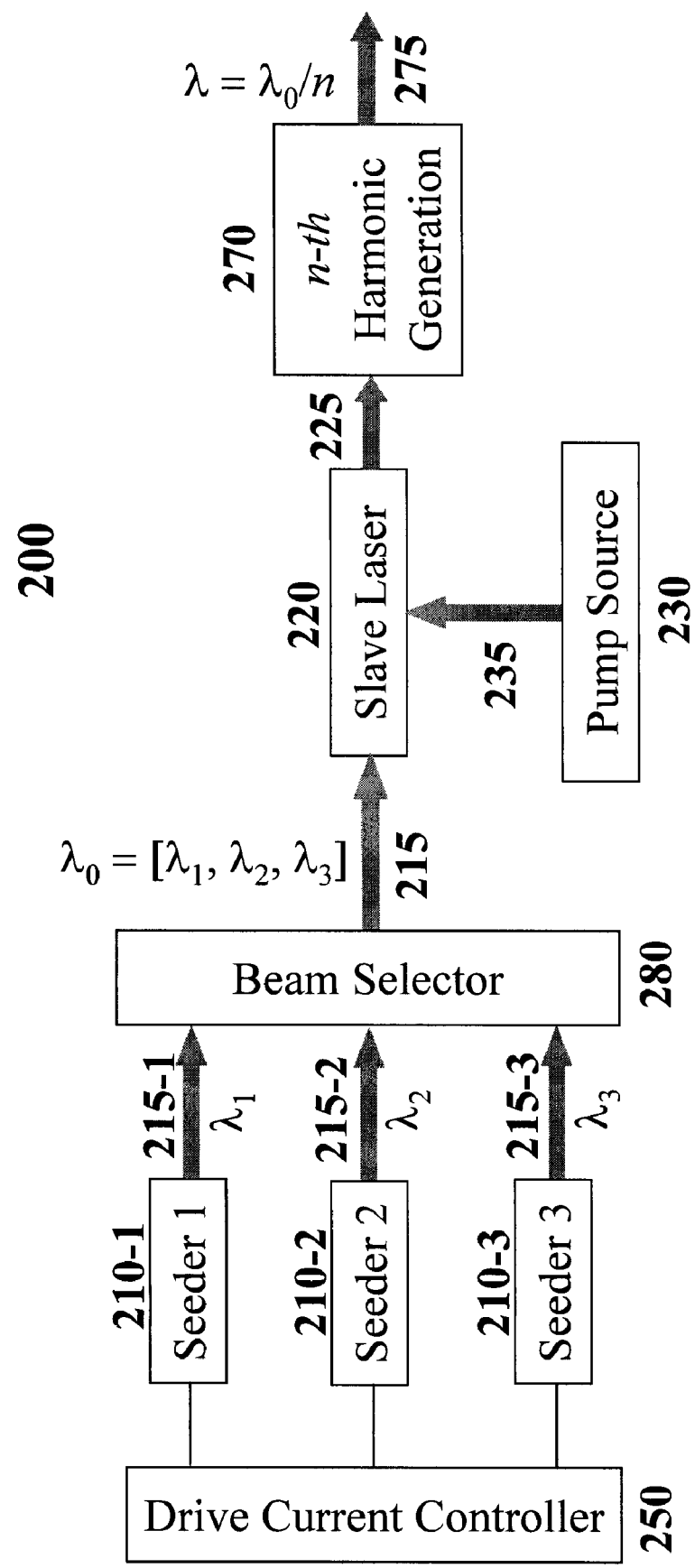

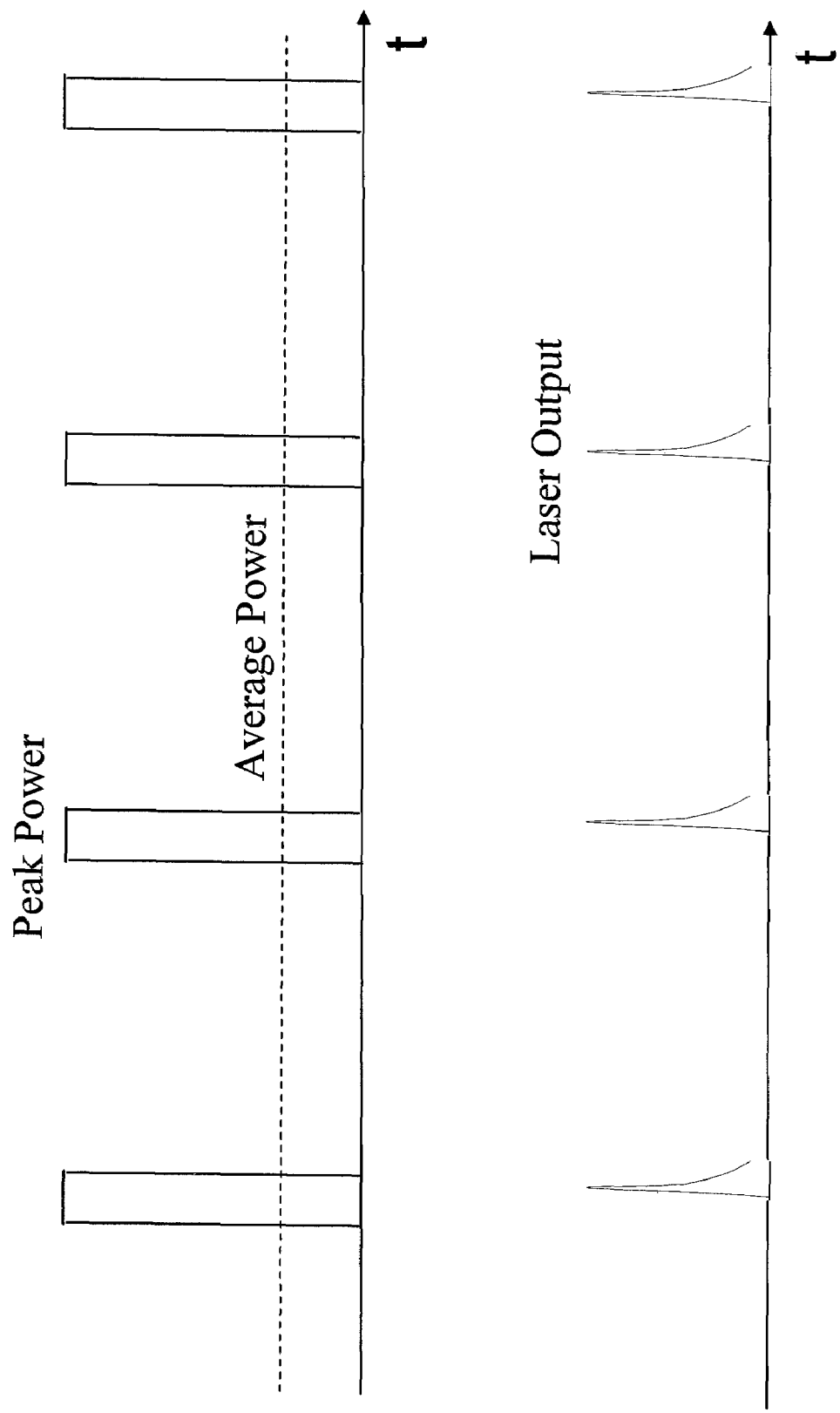

METHOD AND APPARATUS FOR PRODUCING UV LASER FROM ALL-SOLID-STATE SYSTEM

FIELD OF THE INVENTION

This invention relates in general to generation of coherent UV light and in particular to generation of UV laser from an all-solid-state system.

BACKGROUND OF THE INVENTION

Coherent ultraviolet (UV) radiation has been widely used in material processing including micromachining, instrumentation, medical therapy/treatment/implant, and many other important applications. Medical applications are essentially based on interaction of UV light with human tissues. Laser material processing has become a key enabling technology in the ever-continuing trend of miniaturization in microelectronics, micro-optics, and micro-mechanics. Laser material processing is primarily based on conversion of the radiation energy into heat. During the process, the material experiences phase transition, from solid state to gaseous (plasma) state. The accompanying high temperature generates a Heat Affected Zone (HAZ), which is the source of many undesired machining properties, such as poor surface finish, internal remaining stress, etc. This problem becomes even more serious for high-energy conditions unless the laser is operated at short pulses. When the intense laser-material interaction occurs in a very short time period (maximum 20 ns, best less than 1-ns), the heat is supplied to the work piece so fast that losses due to heat conduction during drilling, cutting, welding, or marking are negligible. Ideally, only the material to be removed absorbs the incident high intensity laser energy, while the other parts experience little influence.

Current sources of coherent UV light are not entirely satisfactory, each has some unfortunate drawbacks. Excimer lasers can directly produce output beams with high average powers, but require toxic, corrosive halogen gases for operation, which necessitates gas processing, storage and circulation technologies. These lasers are bulky, complex, potentially hazardous, and expensive. Furthermore, they cannot operate at high pulse repetition rates, and their beam transverse mode is quite far from $TEM_{00}$. Ion lasers including frequency-doubled ion lasers are available at a number of wavelengths in the visible and UV region. However, they are inefficient, have high operating costs and short lifetimes. Dye lasers are impractical for large-scale industrial production since they require frequent changes of the liquid dye solution to maintain operation. In comparison with excimer lasers, solid-state UV lasers have the advantages of compact structure, maintenance-free, improved reliability, and can be operated at much higher repetition rates with much less energy fluctuations.

Solid-state UV lasers typically employ nonlinear optical processes for frequency conversion. For example, a wavelength converter disclosed by Masuda et al. in U.S. Pat. No. 6,249,371 comprises two laser sources. Two nonlinear optical processes are successively applied to the first laser source for fourth harmonic generation (FOHG). The converted wavelength is then mixed with the wavelength of the second laser source for sum frequency generation (SFG). Alternatively, in U.S. Pat. No. 6,373,869, Jacob teaches an optical system for producing UV radiation comprising a laser source that emits the fundamental wavelength, an optical parametric oscillator (OPO), a frequency doubler, and a mixer.

In U.S. Pat. No. 6,031,854, Ming teaches a diode pumped cascade laser for UV generation. A first solid-state laser is Q-switched to produce laser pulses of shorter than 50 ns with multiple-millijoule energy. This laser is further frequency-doubled to a wavelength near 530 or 660 nm. A second solid-state laser is pumped by the first solid-state laser and is then gain-switched to produce laser pulses of about 1-ns with energy of about 1 mJ. The second solid-state laser is further frequency-converted via fourth or fifth harmonic generation to produce UV output around 210 nm.

In US Patent Application No. 20070177638, Seelert, et al. teaches a solid-state laser based on a praseodymium-doped crystal gain-medium pumped by frequency-doubled, optically-pumped external-cavity surface-emitting semiconductor laser to produce laser in the visible spectral range. In particular, a Pr:YLF laser that produces a fundamental wavelength at 522 nm is investigated. After frequency doubling, a UV light of around 261 nm is obtained.

An alternative approach is described by Owa et al. in U.S. Pat. No. 6,088,379, wherein a Ti:Sapphire laser generating a wavelength of approximately 707 nm is used as the first light source and a frequency-quadrupled neodymium-doped solid-state laser generating wavelength near 266 nm is used as the second light source. The two laser beams are then sum-mixed in a nonlinear crystal to produce UV wavelength of approximately 193 nm.

Titanium-doped sapphire (Ti:sapphire or $Ti:Al_2O_3$) is a solid-state lasing material having a broad vibronic fluorescence band. This spectroscopic property allows tunable laser output between 670-1070 nm with the peak of the gain curve around 800 nm. With fourth harmonic generation, it is possible to produce laser output at a wavelength below 200 nm. In US Patent Publication No. 20050094682, Tulloch, et al. discloses a Ti:sapphire-based laser system that produces tunable UV output between approximately 187 and 333 nm. Ti:sapphire exhibits a broad absorption band, located in the blue-green region of visible spectrum with a peak around 490 nm. It is commonly pumped by another laser, e.g., argon ion laser, copper vapor laser, frequency-doubled diode pumped Nd:YLF laser or Nd:YAG laser. This reduces the overall efficiency and makes the system complicated and expensive.

While there is no commercially available edge-emitting laser diode that produces laser wavelength around 490 nm, such wavelengths can be produced by GaN or GaInN light emitting diodes (LED). Based on amplified spontaneous emission (ASE), LED radiation is incoherent and quasi-monochromatic, typically with a bandwidth around a few nanometers. Quite a few lasing gain media, in particular those with broad absorption spectra, can be spectrally matched with LED emission.

Compared to semiconductor laser devices, LED normally has wider divergence angles, around ±20°. For efficient and uniform injection of the pump energy into lasing gain media, US Patent Application No. 20050201442, entitled "Solid-State Lasers Employing Incoherent Monochromatic Pump", discloses an apparatus, wherein a diffusion pump chamber effectively surrounding the gain medium is employed to enhance effects of the pump light on the gain medium. With this apparatus, laser output at a wavelength below 800 nm can be directly produced from a solid-state system.

Efficient nonlinear processes require stable wavelength and intensity, as well as $TEM_{00}$ beam quality. A common approach to stabilizing laser wavelength is injection seeding. A basic requirement for effective injection seeding is that resonance between the slave modes and the photons from the master must be kept whenever the oscillation modes are established. Conventionally, the master-slave resonance is based on stabilized mode frequency of the seed laser (master), active control of the resonance wavelength or longitudinal modes of the seeded laser (slave), and locked phase angle between the injected and output signals. These technologies require complex and expensive systems.

A novel technology that employs continuous wavelength sweeping for master-slave resonance was disclosed by Luo et al. in United States Patent Publication No. 20060215714, entitled "Injection Seeding Employing Continuous Wavelength Sweeping for Master-Slave Resonance". By intentionally varying the seed laser drive current at a radio frequency (RF), the wavelength emitted from the seed laser continuously sweeps over a range covering one or more longitudinal modes of the slave oscillator. The swept spectrum has a stabilized profile with stabilized central wavelength. Active cavity length control and phase locking between the seeder and the seeded laser thus are not needed.

Many applications require reliable mid to high average power UV including DUV (wavelength <200 nm) lasers with short pulse width (<10 ns, ideally <1 ns) and high repetition rate (>100 kHz). To date, no commercially available lasers can meet all these requirements in an efficient and cost-effective manner.

SUMMARY OF THE INVENTION

It is therefore an object of the present invention to provide for an all-solid-state UV laser of high efficiency and low cost. In particular, it is capable of producing short pulse width (<1 ns), variable pulse shape, and high repetition rate (>100 kHz).

Viewed from a first aspect, our invention employs incoherent and quasi-monochromatic (bandwidth <100 nm) light sources such as LED arrays as the pump source to optically activate solid-state gain media including those whose absorption spectrum does not match with the emission wavelength of any commercially available edge-emitting laser diodes. This enables directly producing laser wavelength below 800 nm.

Viewed from a second aspect, effects of incoherent quasi-monochromatic pump light on the gain medium are enhanced by a recycling mechanism such as a diffusion pump chamber to provide diffuse reflection of the pump light that strikes the diffusively reflective inner surface of the chamber.

Viewed from a third aspect, the solid-state laser output wavelength is stabilized by injection seeding in such a way that master-slave resonance is realized by continuous sweeping of the seeder wavelength, which thereby eliminates the needs for active cavity length control and phase locking.

Viewed from a fourth aspect, continuous sweeping of the seeder wavelength is achieved by intentional change of the seeder drive current at a frequency substantially higher than the reciprocal of the lifetime of the slave gain medium upper state.

Viewed from a fifth aspect, the wavelength of the solid-state laser output is converted to UV via one or more nonlinear optical processes.

Viewed from a sixth aspect, one or more LED arrays are selectively operated in CW mode or pulse mode. When the LED arrays are operated in pulse mode, the peak power can be substantially higher than the average power, depending on the pulse width and the pulse repetition rate.

Viewed from a seventh aspect, pulsed operation of the solid-state laser can be achieved by Q-switching or gain switching.

Viewed from an eighth aspect, the all-solid-state UV laser comprises a number of seed lasers and the output wavelength of the solid-state UV laser can be adjusted by selecting a seeder that emits laser beam at a wavelength that is or nearly is an integer multiple of the desired UV output wavelength. Preferably, the slave laser gain medium has a broad emission spectrum or several discrete emission wavelengths. Fine tuning of the seeding wavelength can be achieved by adjusting the operating temperature of the selected seeder.

Viewed from a ninth aspect, the slave gain medium is selected from the group including vibronic crystals, solid-state dyes, or other solid-state materials that effectively absorb the LED pump light.

Viewed from a tenth aspect, the inventive master-slave resonance scheme enables direct coating or mounting of the slave resonator mirrors onto the gain medium. In addition, the nonlinear optical crystals can be optically bonded onto the gain medium to form a monolithic structure.

The advantages and novel features of this invention will become more obvious from the detailed description below.

BRIEF DESCRIPTION OF THE DRAWINGS

FIG. 1 is a block diagram of an all-solid-state UV laser according to the present invention;

FIG. 2 is a block diagram of an all-solid-state UV laser with adjustable output wavelength according to the present invention;

FIG. 8 displays waveforms of pump pulses and UV output pulses in time domain.

DETAILED DESCRIPTION OF THE PRESENT INVENTION

Figure 3A:
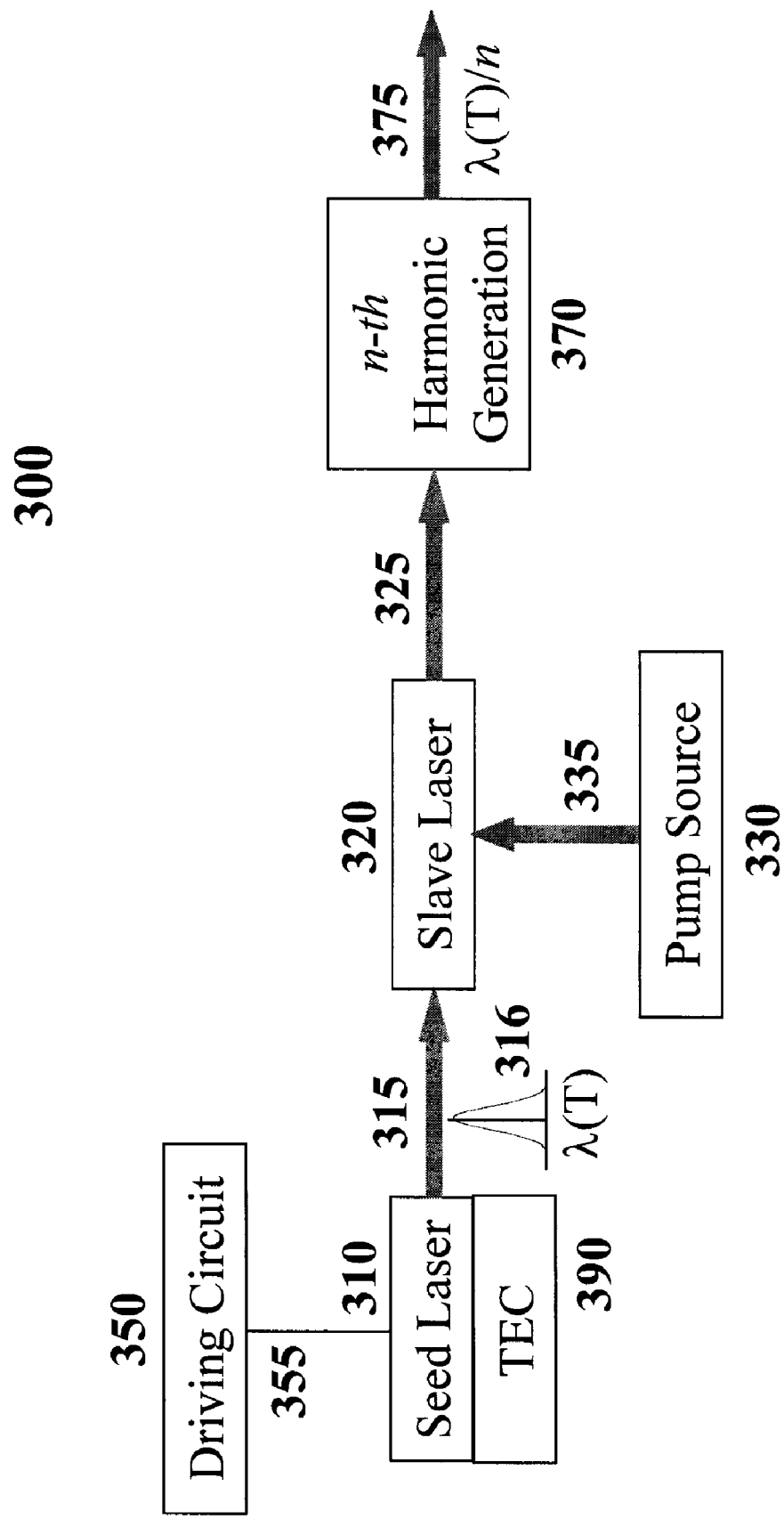
FIG. 3A illustrates a scheme for fine tune of the wavelength from an all-solid-state UV laser according to the present invention.

As will be described in more detail hereafter, there is disclosed herein an all-solid-state UV laser system capable of producing short pulse width, variable pulse shape, and high repetition rate with high efficiency and low cost.

Referring to drawings and in particular to FIG. 1, wherein a conceptual block diagram of an all-solid-state UV laser 100 is illustrated. As shown in FIG. 1, the all-solid-state UV laser system 100 is composed of a seed laser 110 as the master, a seeded laser 120 as the slave, a pump assembly 130 that emits light 135 for optically activating the seeded laser, optical elements 140 for shaping the seed beam 115, one or more optical isolator(s) 160 for preventing interference to and/or damage of the seeder due to optical feedback from the seeded laser, and one or more nonlinear optical crystal(s) 170 for converting the wavelength of the laser output 125 to UV 175. The drive circuit 150 generates RF modulated drive current 155 such that the wavelength of the seed beam 115 sweeps over a range covering one or more longitudinal mode(s) of the seeded laser 120. A conceptual illustration of the master-slave resonance is hereby given by 126.

Advantageously, the seed laser 110 is an electric current driven laser device such as a laser diode, which, in this FIG. 1, is energized by a driving circuit 150 with RF modulation. As the drive current varies, the wavelength of the light 115 emitted from the seed laser 110 changes, whereby resulting in a continuous wavelength sweeping spectrum 116. Through beam shaping optics 140 and isolator 160, the light 115 is injected into the slave laser 120, as seeds. With continuous wavelength sweeping for non-invasive master-slave resonance, the needs for active control of the salve laser cavity length and for locking the phase between the injected and output signals are completely eliminated. As can be appreciated by those skilled in the art, the seed laser is not restricted to laser diode. It can be other light sources producing continuous wavelength sweeping over a range covering one or more longitudinal modes of the slave laser. Depending on the number of longitudinal modes covered by the seed wavelength sweeping spectrum, the laser output 175 can be multimode or single mode.

On the other hand, the slave laser 120 is energized by a pump source 130 so that substantial population inversion is created. Generated by the pump source 130, the pump light 135 can be continuous or a series of pulses. Timing synchronization between 115 and 135 is generally not required. Coupling between the seeder and the seeded laser can be free space or fiber optics.

The gain medium of the salve laser 120 can be solid-state glass or crystal doped with active ions or dye. To date the most popular dye used for the dye laser is Rhodamine 6G. The reason for its popularity is its low cost, effectiveness, availability and low toxicity. Using Rhodamine 6G as the dye enables tuning of the output laser beam's wavelength between 540 nm to 640 nm, depending on other factors in the laser. Rhodamine 6G is among the gain media that directly produce a wavelength shorter than 800 nm, requiring less nonlinear optical processes to generate UV. Other examples of gain media with laser emission wavelengths shorter than 800 nm include Alexandrite (700-818 nm), Ti:sapphire (670-1070 nm), and praseodymium-doped crystals (radiative transitions in the red, orange, green, and blue spectral regions).

The pump source 130 can be one of the following: flash lamps, arc lamps, laser diodes, laser diode arrays, LED arrays, VCSEL arrays, other lasers including diode pumped solid-state lasers with or without harmonic frequency conversion or frequency mixing. Employing LED or VCSEL arrays as optical pump sources has the advantages of relatively low cost, higher reliability, longer lifetime, and more available wavelengths. In particular, LED-based pumping enables direct generation of a wavelength below 800 nm, which is an important advantage for all-solid-state UV lasers.

Employing LED arrays as a pump source enables direct excitation of such gain media as vibronic crystals and solid-state dyes. These gain media have broad-band emission spectra and are tunable. With this attribute, the output UV wavelength can be conveniently adjusted. A preferred embodiment of an all-solid-state UV laser with adjustable output wavelength is schematically illustrated in FIG. 2, wherein a number of seeders 210-$x$ ($x$=1, 2, 3 . . . ), each has a rapidly swept spectrum centered at the desired wavelength $\lambda_i$ (i=1, 2, 3 . . . ), are employed to control the spectrum and the wavelength of the slave laser. One of these seeders is selectively driven by a current controller 250. A beam selector 280 allows only the selected beam 215 with the desired wavelength $\lambda_0$= [$\lambda_1, \lambda_2, \lambda_3$ . . . ] to be injected into the slave laser 220, which is optically activated by a pump source 230. Through one or more nonlinear optical processes 270, n-th harmonic of the laser beam 225 is generated. By proper selection of the seeder wavelength $\lambda_i$, the desired UV wavelength $\lambda_0$/n can be obtained efficiently and cost-effectively. This wavelength selection scheme is enabled by the non-invasive master-slave resonance, which eliminates the needs for active control of the cavity length and phase locking.

Fine tuning of the seeder wavelength $\lambda_0$ can be achieved by adjusting the operation temperature T. It is well-known that the wavelength emitted from a laser diode is determined by the semiconductor material and structure, and is a function of both operating temperature and carrier density. For a typical single-mode laser diode, the wavelength increases monotonically with increasing temperature, and then suddenly jumps to another mode at a longer wavelength. Table I summarizes typical properties of some semiconductor lasers. Common approaches to shifting the light emission toward shorter wavelengths include the use of II-IV materials such as $ZnS_xSe_{1-x}$ (460-530 nm), the increase in the band-gap of III-V materials by addition of nitrogen such as $In_xGa_{1-x}N$ (380-460 nm), and changing the band structure from indirect to direct by incorporating interstitial atoms or by constructing superlattices.

TABLE I

Typical properties of some semiconductor lasers
($0 \leq x \leq 1, 0 \leq y \leq 1$)

| | Semiconductor Material | | |
| --- | --- | --- | --- |
| | $(Al_xGa_{1-x})_yIn_{1-y}P$ | $Al_xGa_{1-x}As$ | $Ga_xIn_{1-x}P_yAs_{1-y}$ |
| Wavelength (nm) | 635-670 | 750-850 | 1300-1500 |
| Gain Bandwidth (nm) | 20 | 30 | 50 |
| d$\lambda$/dT (nm/K) | ~0.2 | ~0.25 | ~0.3 |
| Output Power (mW) | 3-30 | 5-200 | 3-100 |
| Threshold Current (mA) | 30-90 | 20-60 | 20-50 |
| Operating Current (mA) | 50-120 | 50-200 | 40-120 |
| Slope Efficiency (mW/mA) | 0.5-0.7 | 0.7 | 0.2 |

A common approach to controlling operating temperature uses thermoelectric controller (TEC). A preferred embodiment that produces wavelength-adjustable UV laser is schematically illustrated in FIG. 3A. As shown in this FIG. 3A, the operating temperature of the seeder 310 is actively controlled by a TEC 390. The TEC temperature is preset to a value such that the seeder emits a wavelength as close to an integer multiple of the desired UV output wavelength as possible.

With active control of the TEC, the seeder operating temperature is maintained at the preset value during the operation. A TEC typically comprises at least a thermal reservoir for dissipating excess heat, a thermistor for detecting the local temperature, a thermoelectric transducer for temperature-to-current conversion, and an electronic feedback loop for automatic temperature control. A driving circuit 350 injects an RF modulated drive current into the seeder 310 to produce a rapidly swept spectrum 316 with the central wavelength $\lambda(T)$, which is a function of the operation temperature. In operation, the slave laser 320 is activated by the pump light 335 produced from the pump source 330, meanwhile the spectrum and wavelength of the slave laser 320 is stabilized by the injected optical seeds 315. Via n-th harmonic generation 370, the fundamental wavelength $\lambda(T)$ of the slave laser output 325 is converted to UV with the wavelength of $\lambda(T)/n$. It should be obvious to those skilled in the art that there can be several seeders, each has a desired wavelength and adjustable, to produce the UV output at a desired wavelength.

Figure 3B:
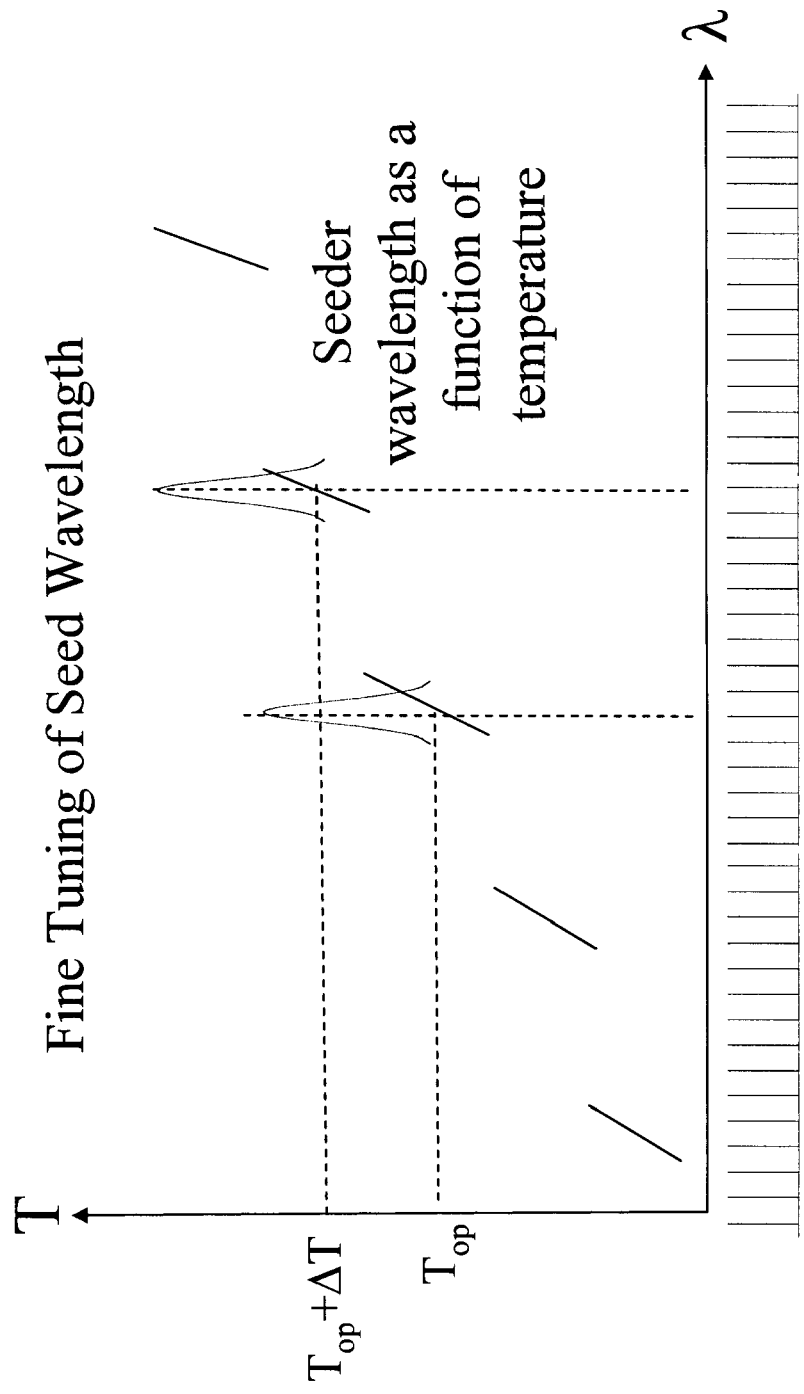
FIG. 3B shows typical temperature-wavelength dependence of a laser diode.

FIG. 3B conceptually shows temperature dependence of the seeder wavelength. By adjusting the operation temperature $T_{op}$, the rapidly swept spectrum of the seeder moves around, enabling fine tuning of the laser output wavelength. The $\lambda$-T functionality for some typical semiconductor lasers is given in Table I. Adjustment of the operation temperature of a laser diode can be accomplished by, e.g., a thermoelectric controller.

Excimer lasers are today's most popular coherent UV sources: XeF (353 nm), XeCl (308 nm), KrF (248 nm), ArF (193 nm), and $F_2$ (157 nm). There is an increasing demand for 193 nm UV lasers in recent years. Conventional all-solid-state lasers that produce 193 nm UV output are complicated and expensive.

Figure 4A:
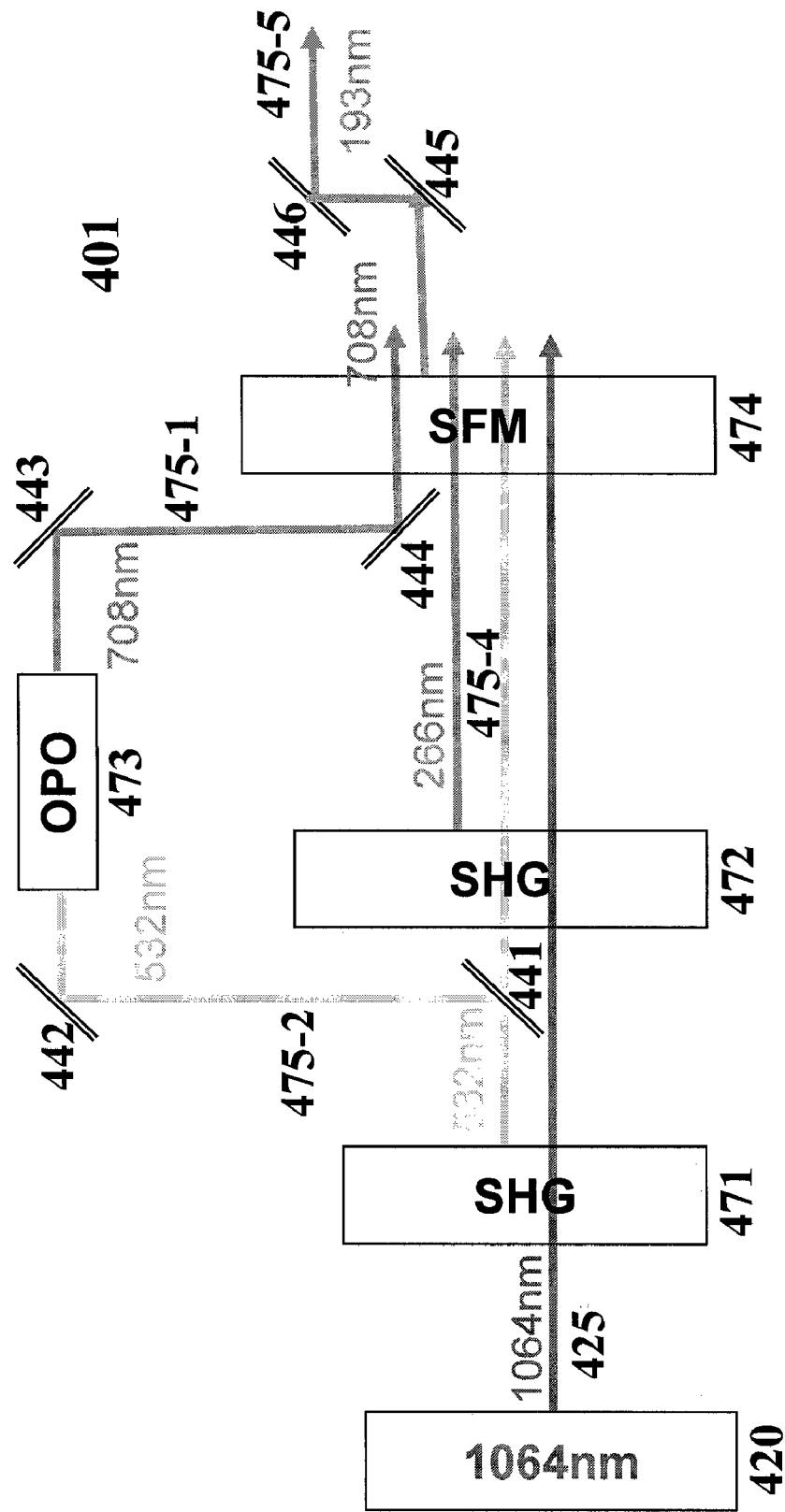
FIG. 4A is a block diagram of an all-solid-state 193 nm laser according to the prior art.

One example of the prior art is schematically illustrated in FIG. 4A. A solid-state laser 420, which can be Nd:YAG or Nd:YVO$_4$, produces a fundamental laser beam 425 of wavelength 1064 nm. The beam 425 is then frequency-doubled in a nonlinear crystal 471. Part of the frequency-doubled laser beam interacts with another nonlinear optical crystal 472 for another second harmonic generation to produce a UV light 475-4 at 266 nm. Another part of the frequency-doubled laser beam 475-2 enters an optical parametric oscillator 473 to produce an IR light 475-1 at 708 nm. The beams 475-1 and 475-4 are mixed in nonlinear optical crystal 474 for sum frequency generation, resulting in DUV laser output 475-5 at 193 nm.

Figure 4B:
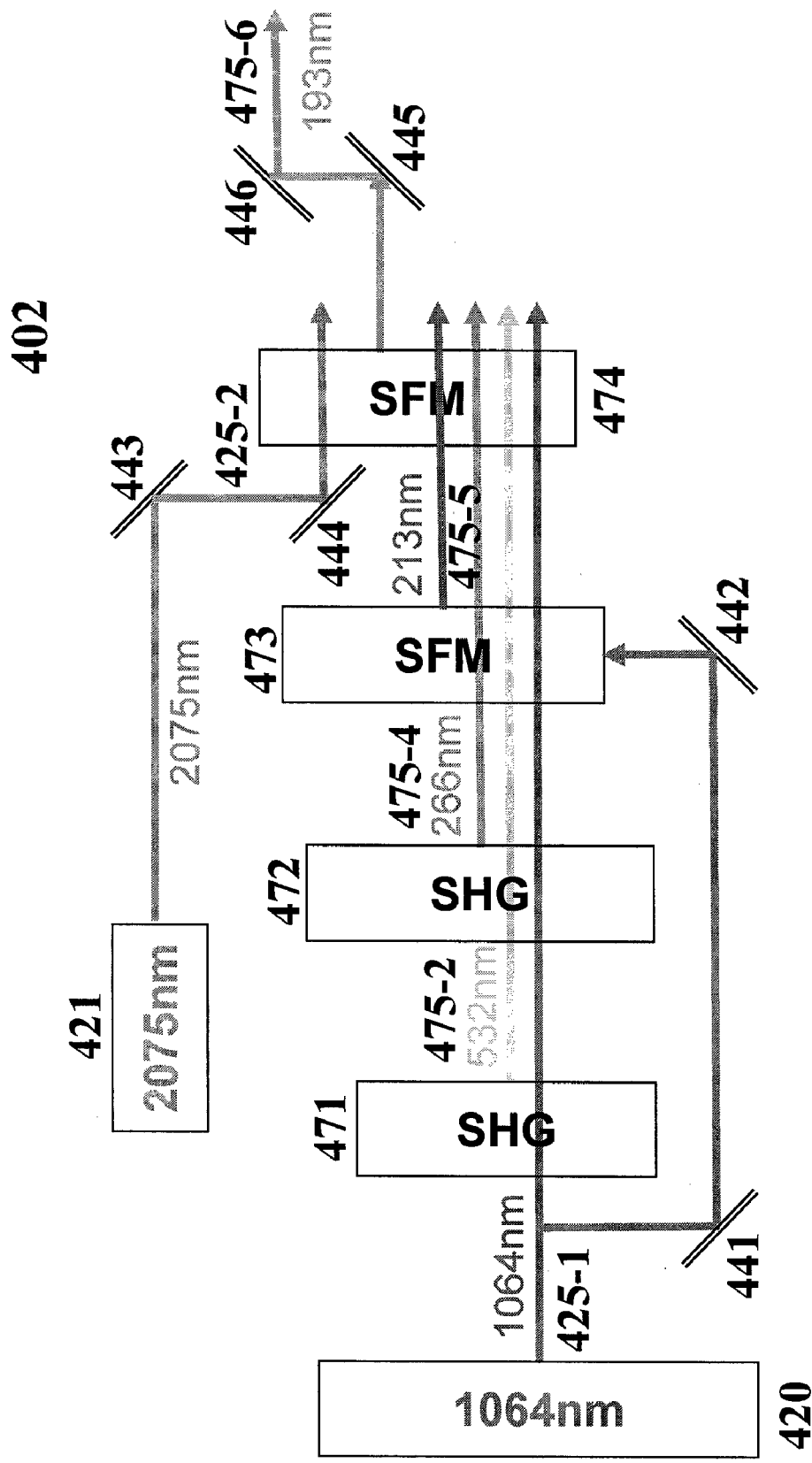
FIG. 4B is a block diagram of another all-solid-state 193 nm laser according to the prior art.

Another example of the prior art is schematically illustrated in FIG. 4B. A solid-state laser 420 produces a fundamental laser beam 425 of wavelength 1064 nm, which is then frequency-quadrupled in nonlinear optical crystals 471 and 472 to produce a UV light 475-4 at 266 nm. Another solid-state laser 421 produces an IR light 425-2 at 2075 nm. In nonlinear optical crystal 473, sum frequency mixing between the beams 475-4 (266 nm) and 425-1 (1064 nm) takes place. The generated fifth harmonic 475-5 (213 nm) is mixed with 425-2 in the fourth nonlinear optical crystal 474 for sum frequency generation, which gives rise to DUV laser output 475-6 at 193 nm.

Figure 4C:
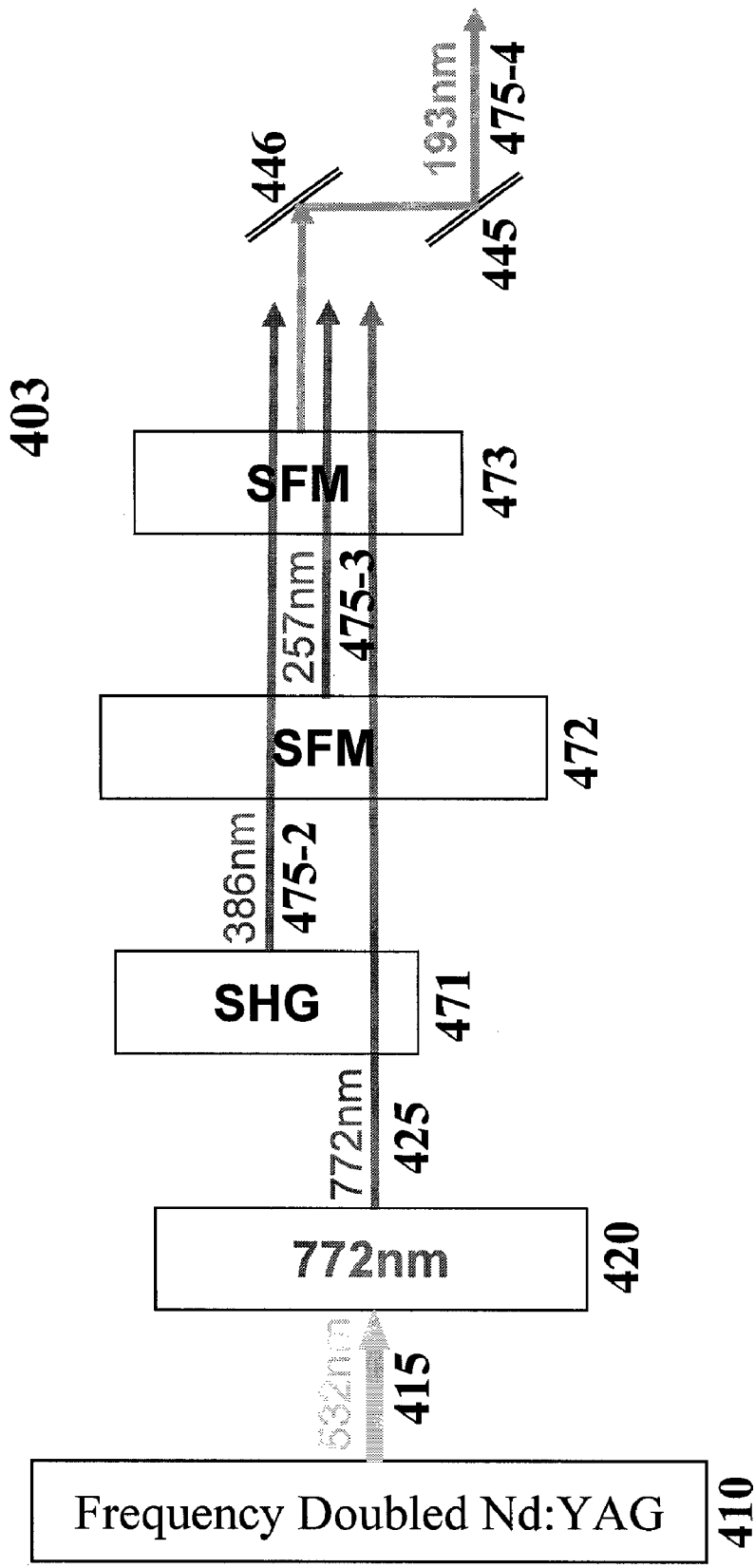
FIG. 4C is a block diagram of yet another all-solid-state 193 nm laser according to the prior art.

Schematic illustration of another prior art DUV laser is in FIG. 4C. A solid-state, e.g., Ti:Sapphire, laser 420 is optically pumped by another solid-state laser 410, which is typically a frequency-doubled Nd:YAG laser, to produce a fundamental laser beam 425 with the wavelength of 778 nm. By interacting with a nonlinear optical crystal 471 for frequency doubling, the laser beam 475-2 (386 nm) is generated. In another nonlinear optical crystal 472, sum frequency mixing between 475-2 and 425 takes place. The third harmonic 475-3 at 257 nm thus generated is then mixed with the fundamental beam 425 in third nonlinear optical crystal 473 for another sum frequency generation to produce DUV laser output 475-4 at 193 nm.

In comparison to 401 in FIG. 4A and 402 in FIG. 4B, the DUV laser system 403 illustrated in FIG. 4C requires less nonlinear optical processes. However, the Ti:Sapphire laser 420 is pumped by another solid-state laser (e.g., frequency-doubled Nd:YAG), making the system complicated and the cost high.

All-solid-state UV lasers normally employ injection seeding for spectrum and wavelength stabilization. Conventionally, injection seeding requires active control of the slave laser cavity length and locking the phase between the injected signal and the output signal, which further complicates the system and increases the cost.

The present invention successfully overcomes these deficiencies by employing a new pump source that enables direct excitation of the gain medium having an absorption spectrum peaked in the blue-green region to produce a fundamental laser wavelength below 800 nm, and by incorporating a novel injection seeding method based on rapid wavelength sweeping. The gain media that produce emission spectra centered around or below 800 nm include vibronic crystals such as Ti:Sapphire, solid-state dyes such as Rhodamine 6G, and trivalent praseodymium doped materials such as Pr:YLF with laser emissions at 522, 545, 607, 639.5, 720 and 907.4 nm.

Figure 5A:
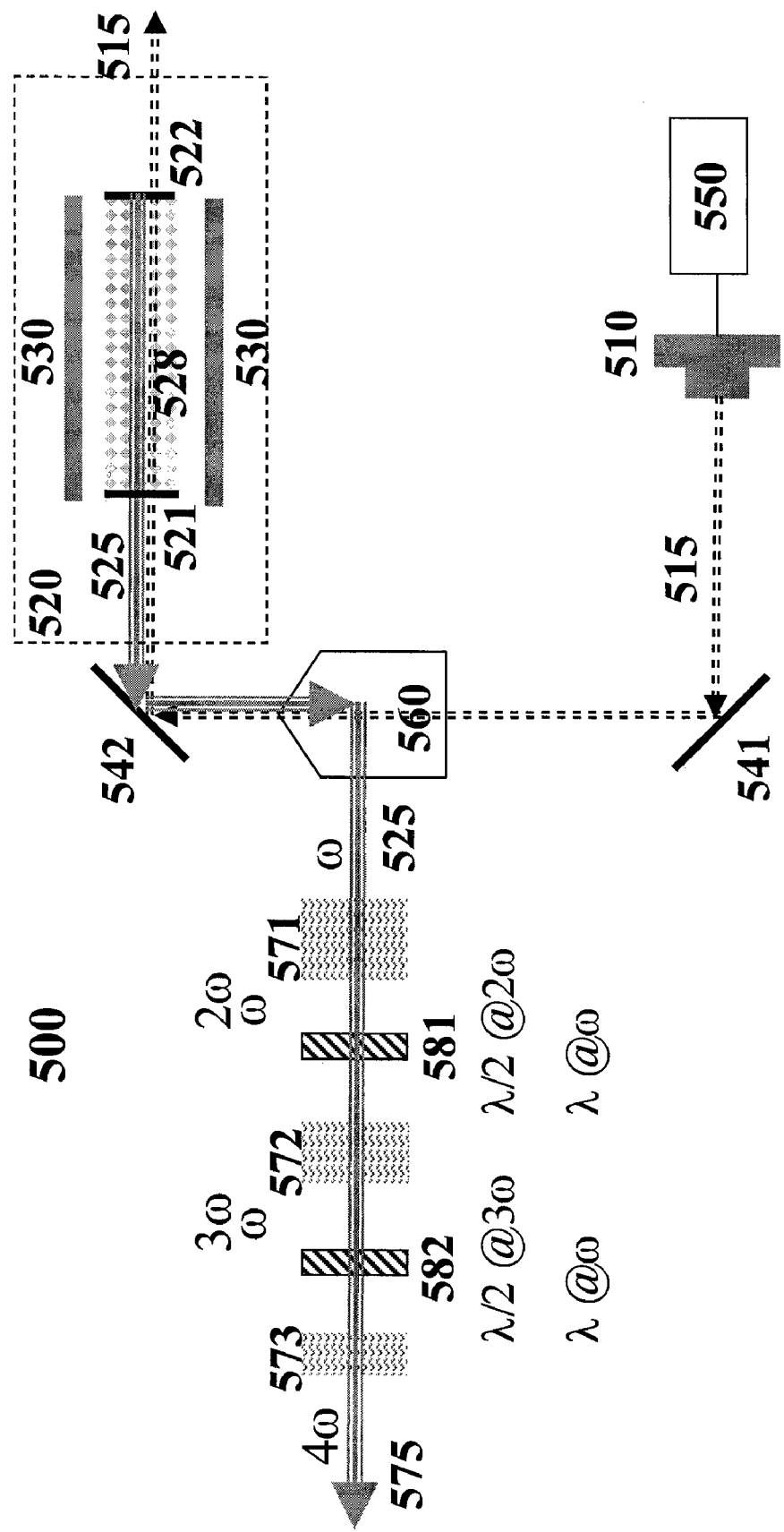
FIG. 5A schematically illustrates an inventive all-solid-state laser that produces UV light adjustable over a range covering at least from 190 nm to 200 nm.

A preferred embodiment of all-solid-state DUV laser constructed in accordance with the present invention is schematically illustrated in FIG. 5A. A slave laser 520 comprises a Brewster-cut laser gain medium 528, which in this particular example is Ti:Sapphire, a pump assembly 530, and an optical cavity composed of a highly-reflective mirror 522 and a partially-reflective mirror (output coupler) 521 for establishing laser oscillation when the threshold conditions are met. The mirrors 521 and 522 can be directly coated on the two ends of the gain medium 528 or separately disposed on the two sides of the gain medium with a distance that does not need to be adjustable. A seed laser 510, which is driven by an RF modulated current generated by circuit 550, injects optical seeds 515 with continuously swept wavelength into the slave laser 520, whereby master-slave resonance occurs. An optical isolator 560 is employed for preventing the seeder from interference or damage caused by the light fed back from the slave laser oscillator.

In order to produce UV or DUV radiation from the injection-seeded laser system, one or more nonlinear optical crystal(s) are introduced for frequency doubling and/or sum frequency mixing. As illustrated in FIG. 5A, three nonlinear optical crystals 571, 572, and 573, which can be BBO or the like, are for frequency conversions. In this particular example, the nonlinear optical process in 571 is second harmonic generation (SHG), $\lambda_1=\lambda/2$, where $\lambda$ is the fundamental wavelength produced from the injection-seeded laser output 525, while in crystals 572 and 573, sum frequency generations (SFG) take place, respectively, $\lambda_2=\lambda\lambda_1/(\lambda+\lambda_1)$, and $\lambda_3=\lambda\lambda_2/(\lambda+\lambda_2)$. Two wave plates 581 and 582 are inserted between the nonlinear crystals for rotating the polarization states to meet the phase matching requirements. For a seeder with wavelength $\lambda=772$ nm, the laser output 575 has a wavelength of $\lambda_3=193$ nm, which can be a replacement of ArF excimer laser.

Figure 5B:
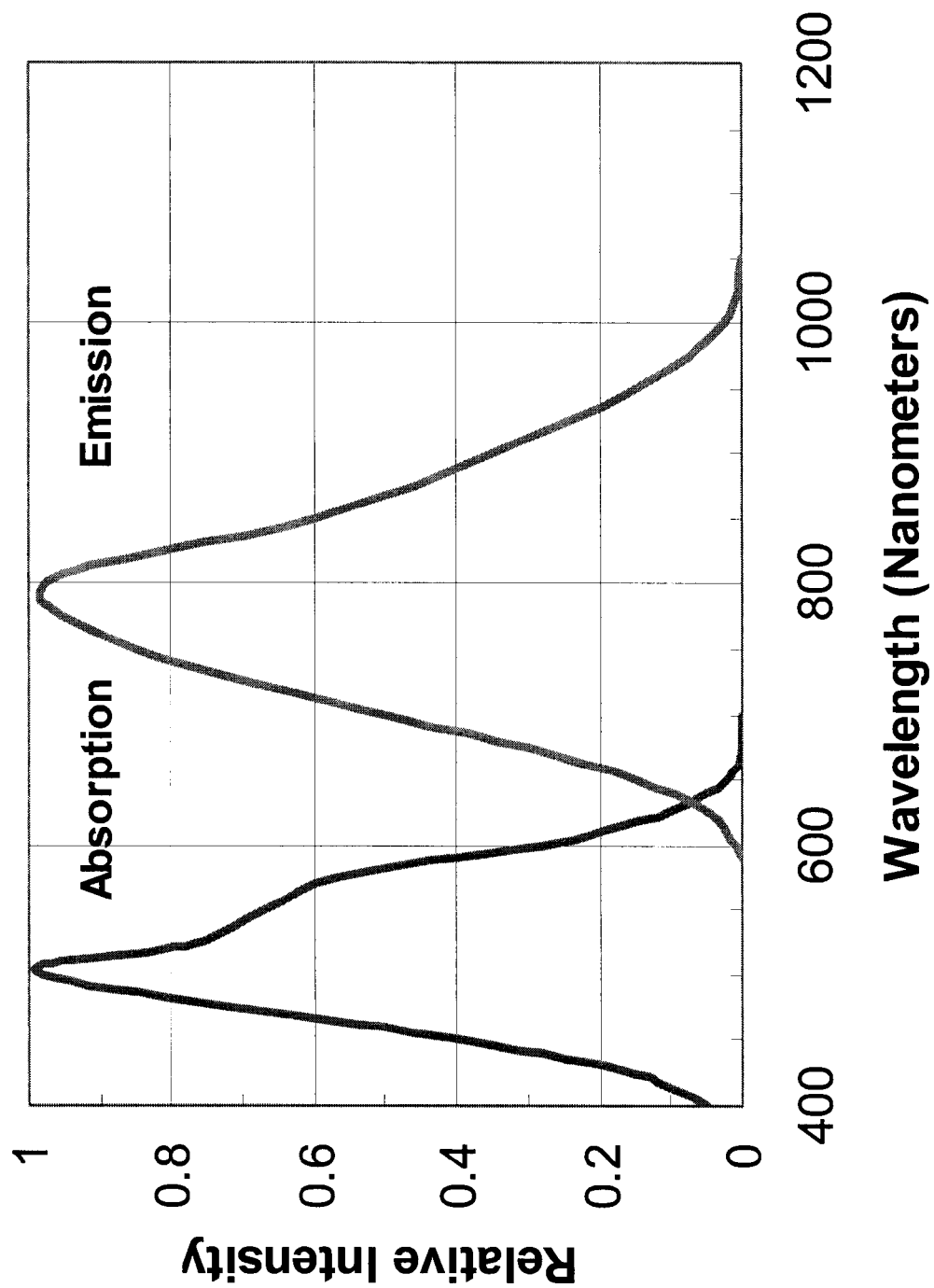
FIG. 5B shows the absorption and emission spectra of titanium-doped sapphire.

FIG. 5B shows the absorption and emission spectra of Ti:Sapphire laser gain medium. It should be obvious to one of ordinary skill in the art that various other solid-state lasing gain media including, but not limited to, crystals with broadband emission spectra such as Alexandrite and Cr:LiSAF or other chromium-doped gain media, as well as other host materials doped with active ions such as rare earth ions, actinide ions, and transition metals, in free-running slave cavities of length from ultra short to long, can be employed for producing UV or DUV laser without departure from our inventive principles. Moreover, selection of operation modes (CW or quasi-CW or pulsed mode, SLM or multimode, with or without Q-switch) is a matter of engineering design.

Dye lasers have the advantages of broad and continuous tunability within the visible spectrum, while exhibit high energy efficiency. Organic polymers such as poly(methyl methacrylate) (PMMA) and poly(acrylic acid) (PA) have been widely used as hosts for laser dyes. Silica-based inorganic polymers such as alumosilicates, titania-silica, and titania-ormosils or ormosils have also been investigated as matrices for laser dyes since they have superior mechanical, thermal and optical properties. However, these solid-state dye lasers generally have a limited lifetime due to photo-degradation of the incorporated dyes caused by intense local pumping light. Photo-stability of dyes embedded in a solid matrix depends on the dye structure and the host composition. For example, the addition of small amounts of zirconia to the ormosil matrix improves the photo-stability of incorporated Rhodamines.

Many different types of host have been demonstrated for solid-state dye lasers. Pre-doped hosts usually produce solid materials with good optical quality and uniform dye concentration. Post-doped materials are usually more 'glass-like', with many of the excellent bulk properties of glass, but can be susceptible to losses owning to excessive optical scatter from the pores in the host matrix. Characteristics required for dye molecules of effective laser performance include high fluorescence yield, good photo-stability, and low excited state losses. The performance and compactness of solid-state dye lasers could be further enhanced through the application of incoherent or partially coherent, monochromatic or quasi-monochromatic (bandwidth <100 nm) pump sources.

Because of their high efficiencies and high fluorescence quantum yields, Rhodamines have been widely used for dye lasers. Common host materials include modified PMMA and organically modified silicates.

Figure 6A:
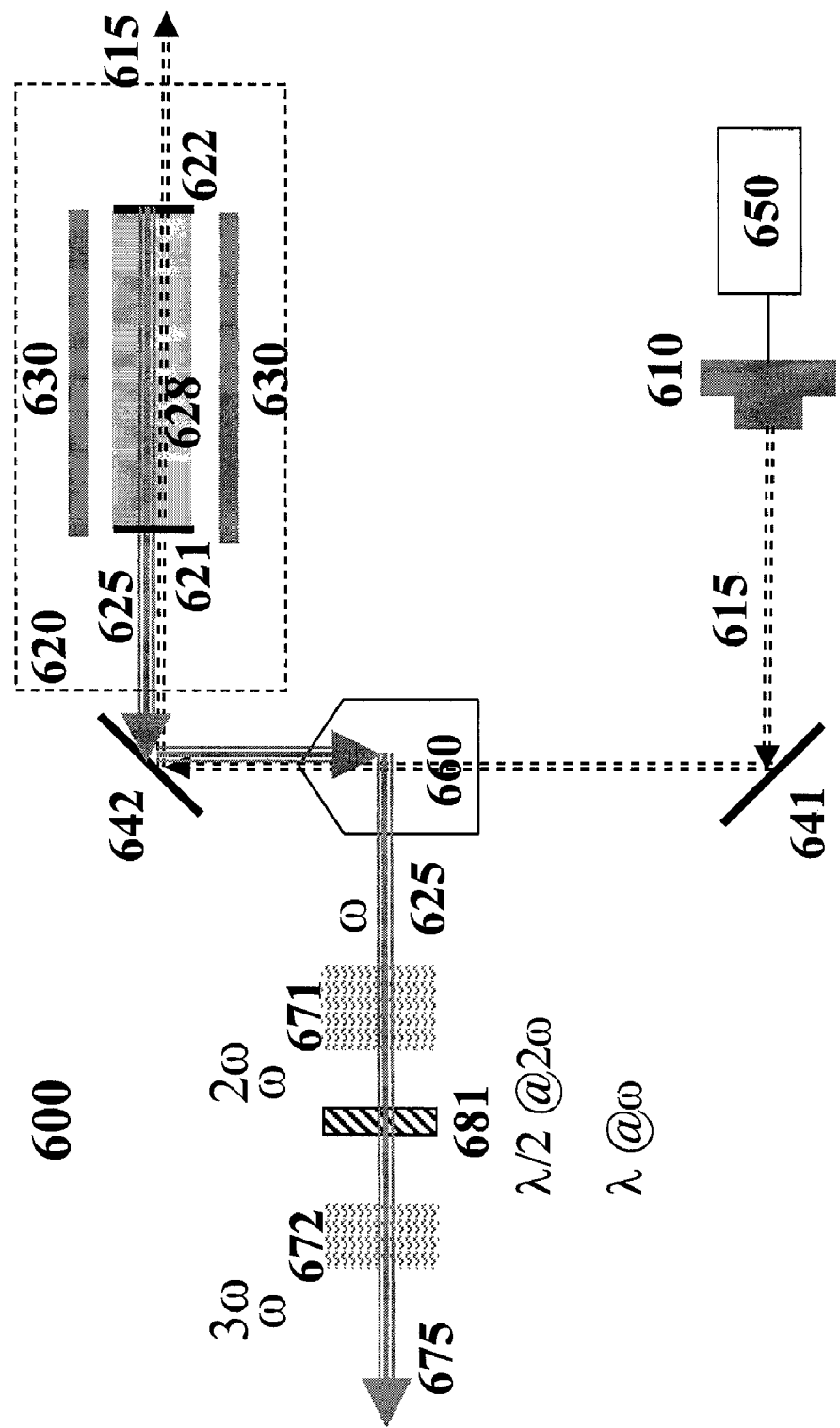
FIG. 6A schematically illustrates another inventive all-solid-state laser that produces UV light adjustable over a range covering at least from 190 nm to 200 nm.

A preferred embodiment of solid-state device for producing DUV laser at a wavelength between 190 nm and 200 nm is schematically illustrated in FIG. 6A. The lasing gain medium 628 is a solid-state material doped with Rhodamine 6G and is side-pumped by an excitation element 630 that emits light at a wavelength near the peak of the absorption spectrum of the dye molecules. Advantageously, the pumping effect is enhanced by multi-pass excitation through diffusive reflection or specular reflection of unabsorbed light from the inner surface of a pump chamber substantially surrounding the lasing gain medium but for any end regions. Preferably, the gain medium 628, which can be a rod or a slab or a disk, is so installed that refurnishing or replacement is easy and convenient. A seed laser 610 injects optical seeds 615 through one of the cavity mirrors into the gain medium 628. According to the present invention, the wavelength of these optical seeds is rapidly swept around the wavelength desired to be produced from the slave laser 620. An optical isolator 660 is employed to prevent the seed laser from interference or damage caused by the feedback light.

Upon substantial population inversion in the gain medium 628, the slave laser 620 produces laser beam 625 at a wavelength between 570 nm and 600 nm, depending on the wavelength of the injection seeding. Following a frequency-tripling process in nonlinear optical crystals 671 and 672, DUV laser output 675 in a range between 190-200 nm is generated. Compared to the configuration in FIG. 5A, the nonlinear optical process in FIG. 6A is thereby simplified.

Figure 6B:
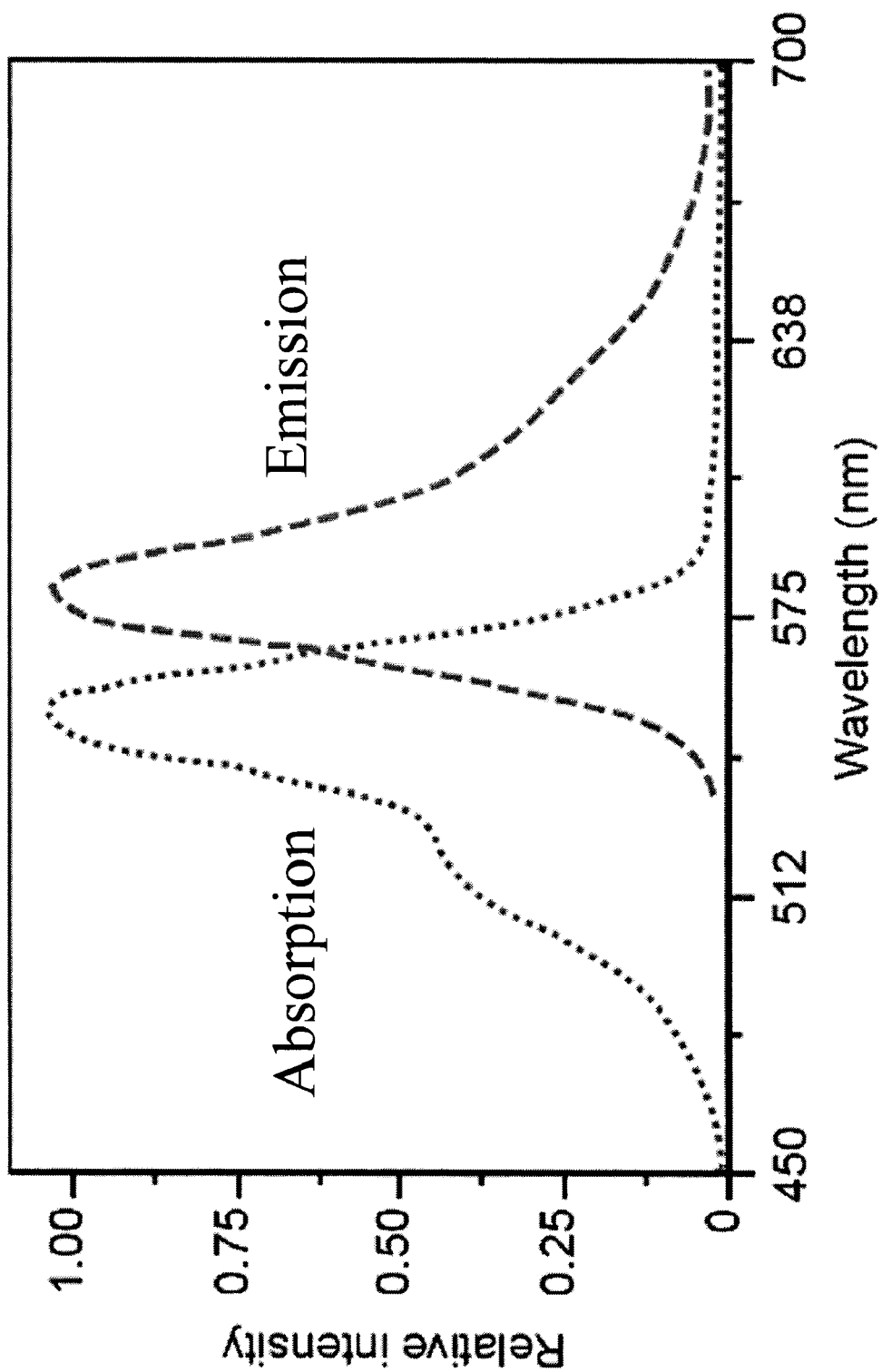
FIG. 6B shows the absorption and emission spectra of Rhodamine 6G.

FIG. 6B shows the absorption and emission spectra of Rhodamine 6G. These spectra are variable depending on the dye concentration and the host material.

Currently available diffusion chambers are designed for lamps, which emit light with a very broad spectrum and over an essentially 4π solid angle, or for laser diodes, which emit monochromatic coherent beams elliptical in shape with a transverse and lateral divergence of about 40 and 10 degrees, respectively. Unlike these conventional pump light sources, the ASE-based LED radiation is incoherent and quasi-monochromatic (with a bandwidth <100 nm). The output beam is cone-shaped typically with a divergence angle of 20-60° FWHM. As an area emitter, LED normally requires integrated micro lens or separated external lens to shape the beam. Diffractive optical elements ate surface microstructures that are typically used for beam shaping of optical light sources Diffractive optical element can be fabricated directly onto the LED at the wafer level, offering an integrated monolithic packaging solution. Due to the diffractive effects, photonic crystals couple substantially more of the light generated within the active layers of the LED than the light generated from a conventional LED with simple planar surface. To further enhance the pump efficiency, a pump chamber with a structure substantially different from those employed for lamp-based pump or diode-based pump is therefore incorporated.

Figure 7A:
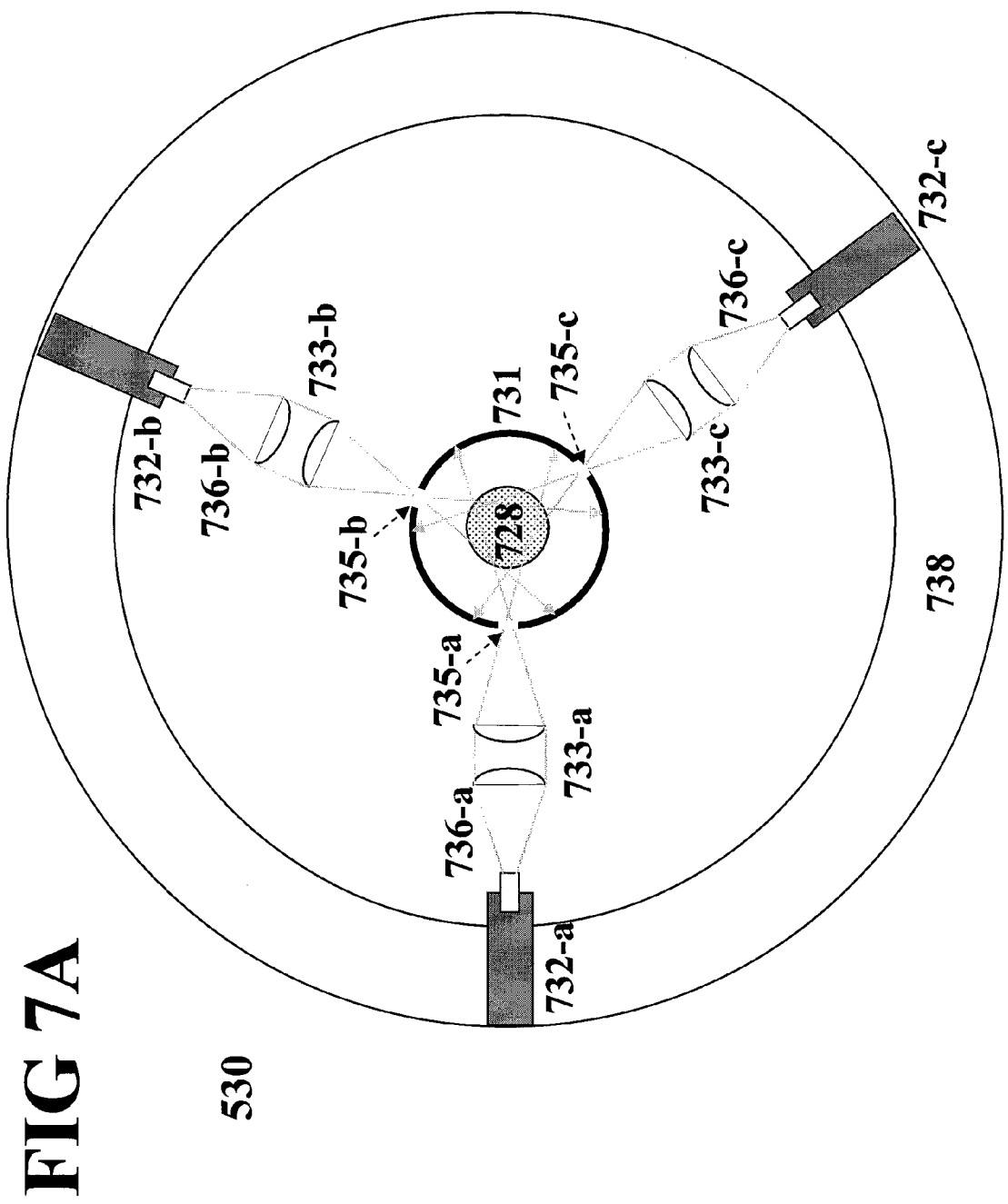
FIG. 7A shows a schematic cross-sectional view of a preferred embodiment of the pumping assembly according to the present invention.

FIG. 7A is a schematic, cross-sectional view of a preferred embodiment of the pump assembly 530, wherein an odd number of LED arrays 732-a, 732-b, 732-c, . . . , together with the heat sinks packaged therewith, are embedded in a housing 738, which is preferably a metal shell or other material that provides suitable physical protection and heat dissipation characteristics. At the center of the pump assembly 530 (shown as the innermost component in FIG. 7A) is a laser gain medium 728, preferably cylindrical in shape and axially aligned. Disposed between the laser gain medium 728 and the housing 738 is a diffusion pump chamber 731 for enhancing the pump effects. The diffusion pump chamber 731 is substantially tubular in shape and the inner surface of the chamber, except for the windows 735-a, 735-b, 735-c . . . that are transparent to the pump light, is diffuse reflective or coated with diffuse reflective materials to provide diffusive reflection. These transmitting windows, each is slit-shaped and axially aligned in parallel to its corresponding LED array, are coated anti-reflectively (AR) to the pump wavelength to allow the pump light entering into the chamber with minimum loss. The pump beams 736-a, 736-b, 736-c . . . emitted respectively from their corresponding LED arrays 732-a, 732-b, 732-c . . . , each is focused by a set of optical elements so that the beam waist is in close vicinity to the corresponding transmitting window. In this FIG. 1A, the optical elements 733-a, 733-b, 733-c . . . are cylindrical lens pairs, but this is by no means a limitation. Preferably, the width of the transmitting windows is slightly wider than the waist of the focused pump beam. In an alternative embodiment, the transmitting windows are lenses that provide additional beam shaping. Optionally, the space between 728 and 731 contains a circulating air or index-matched coolant to remove the heat generated during laser operation, thereby maintain laser thermal stability. Still optionally, the housing 738 may be hollowed with channels containing circulating liquid to enhance heat removal.

Preferably, the LED arrays are narrow strips, manufactured by the use of Chip-On-Board (COB) technology with high packing density of the dies. Each emitter possesses an integrated reflector to enhance the optical energy extraction and to reduce heat generation. For improving the output beam collimation, each emitter is integrated with a microlens or the entire emitter array is integrated with a microlens array. These microlenses or microlens arrays reflect much of the light fed back from the diffusion pump chamber, further improving the pump efficiency. The electrical power of the pump light source is controlled at the array level. The pump light source can be operated in a continuous mode or a pulsed mode. When the LED arrays are operated in a pulsed mode, the peak power can be enhanced to more than ten times the average value, depending on the pulse width and repetition rate. This attribute is particularly useful for laser gain medium with short upper state lifetime.

Figure 7B:
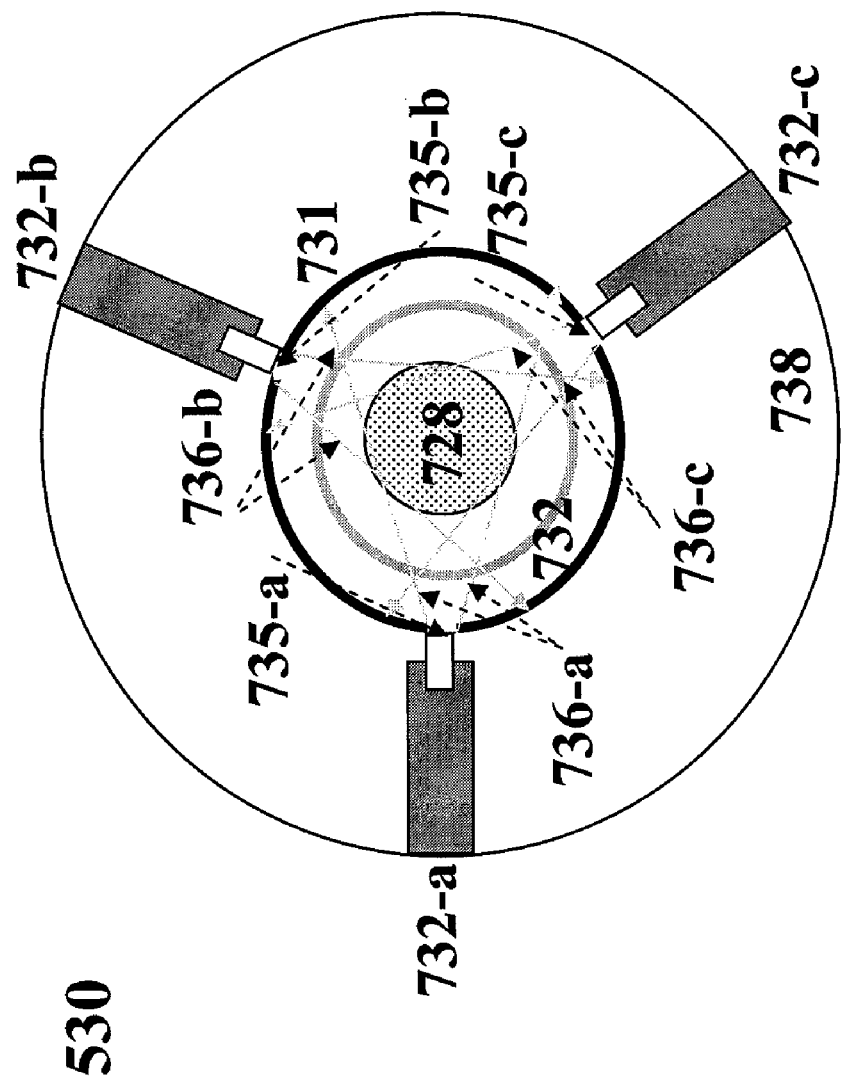
FIG. 7B shows a schematic cross-sectional view of another preferred embodiment of the pumping assembly according to the present invention.
Figure 7C:
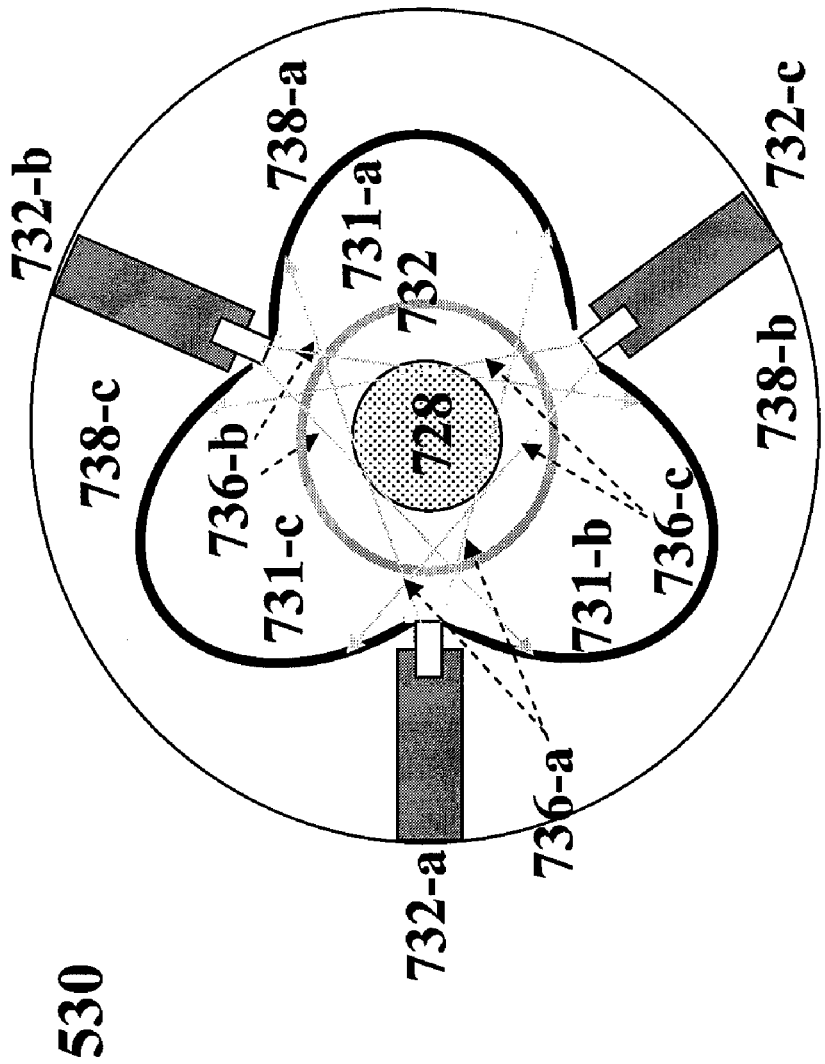
FIG. 7C shows a schematic cross-sectional view of another preferred embodiment of the pumping assembly according to the present invention.

Cross-sectional view of an alternative embodiment of the pump assembly is schematically illustrated in FIG. 7B. The LED arrays are embedded in the housing 738, which also serves as a heat sink to dissipate the heat generated by the LED arrays during the operation. The inner surface 731 of the housing 738 is diffusely reflective to form a diffusion pump chamber. The pump lights 736-a, 736-b, 736-c . . . enter the pump chamber respectively through entry apertures 735-a, 735-b, 735-c . . . . Optionally, an index-matched coolant or air circulates in the space between 728 and 731 to remove excessive heat generated during laser operation thereby maintain laser thermal stability. In an alternative embodiment, a tube 732, which is transparent to the pump wavelength, is disposed between the gain medium 728 and the inner surface 731 of the housing, wherein the index-matched coolant circulates.

Alternatively, the diffusion pump chamber can be assembled by an odd number of segments 738-a, 738-b, 738-c . . . , having inner surfaces 731-a, 731-b, 731-c . . . curved in parabolic or otherwise to provide effective reflection of the light that hits the surface. Preferably, the gain medium 728 is located at or near the focus of these parabolic surfaces. Mounted between these segments are LED arrays 732-a, 732-b, 732-c . . . that respectively emit pump lights 736-a, 736-b, 736-c . . . . One advantage of this configuration is an increased reflection area of the pump chamber relative to the area of the transmitting windows, which improves the pump efficiency. These segments also serve as a heat sink to remove excessive heat during the operation.

Figure 7D:
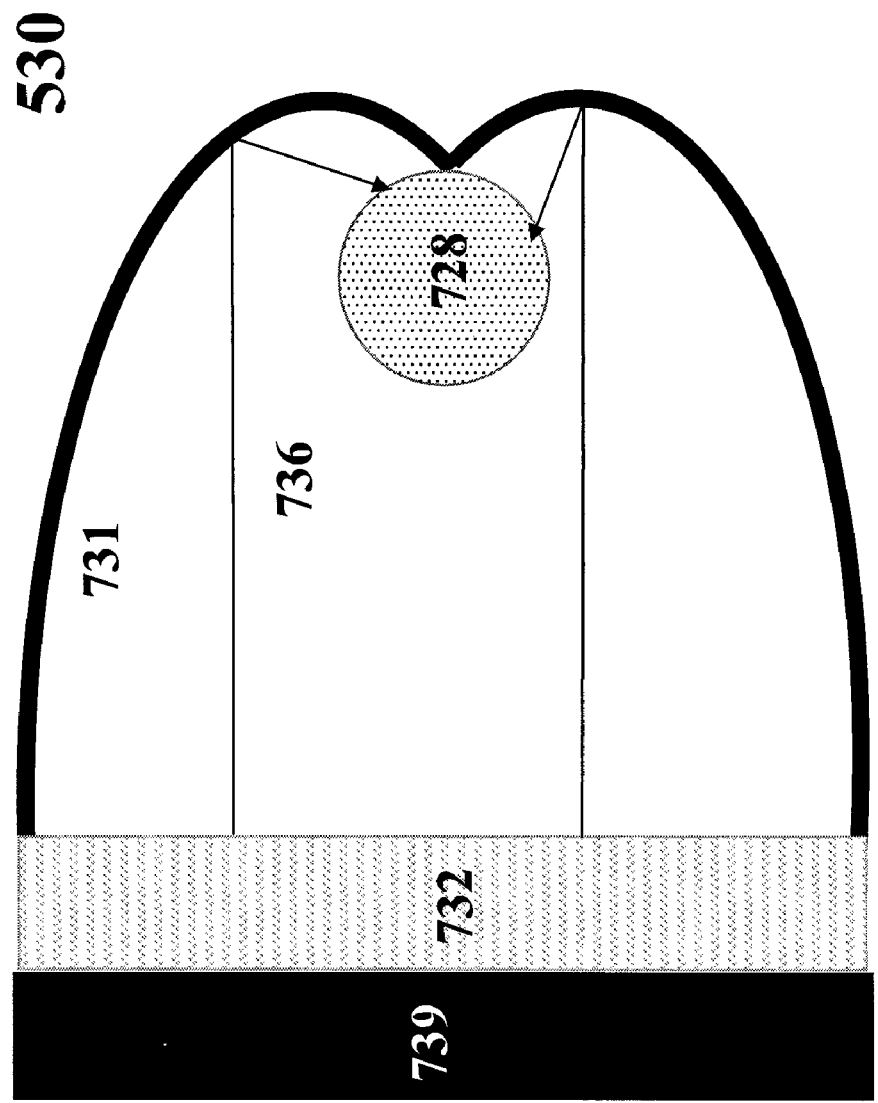
FIG. 7D shows a schematic cross-sectional view of another preferred embodiment of the pumping assembly according to the present invention.

As another preferred embodiment, the diffusion chamber 731 is a highly reflecting Compound Parabolic Concentrator (CPC) with a single parabolic reflecting surface or with two or more overlapped parabolic portions. An exemplary configuration is schematically illustrated in FIG. 7D, wherein a two-dimensional LED array 732 forms one side of the pump chamber and the rest part of the pump chamber surface is a reflector to the pump wavelength. The gain medium 728 is located at or near the focus of the CPC. A heat sink 739 is in physical contact to the LED array 732 for array-level thermal management of the pump light source. Electrical power that energizes the pump light source is also controlled at the array level.

FIG. 8 displays waveforms of pump pulses and UV output pulses in time domain. Advantageously, the peak pump power can be several times higher than the average pump power, depending on the pump duration and the repetition rate. The pump duration can be optimized by matching the upper state lifetime of the gain medium, which is about 3.2 μs for Ti:Sapphire at the room temperature. When operated in a gain switched mode, laser output with a high repetition rate, e.g., higher than 100 kHz, a short pulse width, e.g., less than 10 ns, can be achieved.

What is claimed is:

1. An all-solid-state laser system that produces coherent UV light comprising:
    a seed laser that produces wavelength-swept optical seeds;
    a slave laser oscillator;
    one or more optical isolators to prevent the seeder from interference/damage caused by the light fed back from the slave laser;
    optical elements for effective injection of the optical seeds into the slave laser and for efficient extraction of the laser output;
    one or more nonlinear optical crystals for wavelength conversion;
    wherein said slave laser oscillator further comprises:
    a pair of cavity mirrors;
    a solid-state gain medium disposed between the cavity mirrors;
    an odd number of semiconductor light sources to generate pump light matching the absorption characteristics of the gain medium, each is a narrow array or bar disposed lengthwise along the axis of the slave laser gain medium, to generate monochromatic or quasi-monochromatic (bandwidth <100 nm) excitation light sufficient to cause substantial population inversion in the slave laser gain medium;
    a power supply, electrically connected to the semiconductor light sources, for array level control;
    a pump chamber tubular in shape into which is positioned the slave laser gain medium such that the pump chamber effectively surrounds the gain medium, wherein an inner surface of the pump chamber, except for regions where the pump light enters the pump chamber, is diffusely reflective thereby providing a diffusive reflection of the pump light that strikes the inner surface sufficient to enable a multi-pass absorption of the excitation light by the slave laser gain medium; and
    a light delivery system for effective coupling of the pump light into the pump chamber;
    wherein:
    the seeder is driven by a drive current intentionally changing at a frequency at least one order of magnitude higher than the reciprocal of the upper state lifetime of the slave laser gain medium;
    such that the wavelength sweeping spectrum of the optical seeds is stable and covers one or more longitudinal modes of the slave laser;
    whereby the cavity length of the slave laser oscillator is not actively controlled.

2. An all-solid-state laser system as of claim 1, wherein the slave laser gain medium is one of the followings: vibronic crystals, solid-state dyes, other solid-state materials that effectively absorb the pump light.

3. An all-solid-state laser system as of claim 1 further comprising a tube disposed between the inner surface of the pump chamber and the slave laser gain medium, wherein:
    said tube is transparent to the pump light;
    within the tube an index-matching coolant circulates to remove excessive heat generated during the laser operation.

4. An all-solid-state laser system as of claim 1, wherein the pump chamber is composed of an odd number of segments, the inner surface of each segment is curved in parabolic or otherwise to provide effective reflection of the light that hits the surface, and the slave laser gain medium is located at or near the focus of these curved surfaces.

5. An all-solid-state laser system as of claim 1, wherein:
said semiconductor light source is a two-dimensional array;
onto which a heat-conductive pad, is mounted, for physical protection and for enhancing heat removal;
wherein said pump chamber, is a highly reflecting compound parabolic concentrator with one or more parabolic section(s), such that the two-dimensional light source forms one side of the chamber and the rest part of the pump chamber surface is a reflector to the pump wavelength;
the central axis of the slave laser gain medium is located at or near the focus of the reflector, whereby a population of the active species becomes substantially inverted in response to excitation by the pump light.

6. An all-solid-state laser system as of claim 1, wherein the semiconductor light sources are LED arrays.

7. An all-solid-state laser system as of claim 1, wherein the semiconductor light sources are integrated with microlenses or microlens arrays.

8. An all-solid-state laser system as of claim 1 further comprising a pulse forming unit such that the semiconductor light sources operate at a pulsed mode with control able repetition rate and pulse width.

9. An all-solid-state laser system as of claim 8, wherein:
the pulse width is comparable to the reciprocal of the upper state lifetime of the slave laser gain medium and the peak power of the semiconductor light sources is enhanced at a given average value.

10. An all-solid-state laser system as of claim 1 further comprising:
a Q-switching element.

11. An all-solid-state laser system that produces coherent UV light with selectable wavelength comprising:
at least two seed lasers, each, when selected to be in operation, produces optical seeds with a stable wavelength sweeping spectrum;
an electrical power supplier connected to these seed lasers to provide RF modulated drive current such that a seed laser, whose wavelength sweeping spectrum is centered at a wavelength that is or nearly is an integer multiple of the selected UV output wavelength, is selected and energized;
a beam selector allowing the optical seeds emitted from the selected seed laser to pass;
a slave laser oscillator;
one or more optical isolators to prevent the seeder from interference/damage caused by the light fed back from the slave laser;
optical elements for effective injection of the optical seeds into the slave laser and for efficient extraction of the laser output; and
one or more nonlinear optical crystals to convert the wavelength emitted from the solid-state gain medium and stabilized by the selected seeder to the selected UV;
wherein:
the slave laser gain medium has a broad emission spectrum or several discrete emission wavelengths;
wherein said slave laser oscillator further comprises:
a pair of cavity mirrors,
a solid-state gain medium disposed between the cavity mirrors,
an odd number of semiconductor light sources to generate pump light matching the absorption characteristics of the gain medium, each is a narrow array or bar disposed lengthwise along the axis of the slave laser gain medium, to generate monochromatic or quasi-monochromatic (bandwidth <100 nm) excitation light sufficient to cause substantial population inversion in the slave laser gain medium;
a power supply, electrically connected to the semiconductor light sources for array level control;
a pump chamber tubular in shape into which is positioned the slave laser gain medium such that the pump chamber effectively surrounds the gain medium, wherein an inner surface of the pump chamber, except for regions where the pump light enters the pump chamber, is diffusely reflective thereby providing a diffusive reflection of the pump light that strikes the inner surface sufficient to enable a multi-pass absorption of the excitation light by the slave laser gain medium; and
a light delivery system for effective coupling of the pump light into the pump chamber;
wherein:
the cavity length of the slave laser oscillator is not actively controlled.

12. An all-solid-state laser system as of claim 11, wherein:
each seed laser is in physical contact to a thermoelectric controller (TEC) preset to a temperate such that the seeder emits a wavelength or close to an integer multiple of the selected UV output wavelength;
the seed laser operates at the preset temperature through active control of the TEC.

13. An all-solid-state laser system that produces coherent DUV light with a wavelength below 200 nm comprising:
a seed laser that produces wavelength-swept optical seeds;
a slave laser oscillator;
one or more optical isolators to prevent the seeder from interference/damage caused by the light fed back from the slave laser;
optical elements for effective injection of the optical seeds into the slave laser and for efficient extraction of the laser output; and
one or more nonlinear optical crystals for wavelength conversion;
wherein said slave laser oscillator further comprises:
a pair of cavity mirrors,
a solid-state gain medium disposed between the cavity mirrors,
an odd number of semiconductor light sources to generate pump light matching the absorption characteristics of the gain medium, each is a narrow array or bar disposed lengthwise along the axis of the slave laser gain medium, to generate monochromatic or quasi-monochromatic (bandwidth <100 nm) excitation light sufficient to cause substantial population inversion in the slave laser gain medium;
a power supply, electrically connected to the semiconductor light sources for array level control;
a pump chamber tubular in shape into which is positioned the slave laser gain medium such that the pump chamber effectively surrounds the gain medium, wherein an inner surface of the pump chamber, except for regions where the pump light enters the pump chamber, is diffusely reflective thereby providing a diffusive reflection of the pump light that strikes the inner surface sufficient to enable a multi-pass absorption of the excitation light by the slave laser gain medium; and
a light delivery system for effective coupling of the pump light into the pump chamber;

wherein:
the seeder is driven by a drive current intentionally changing at a frequency at least one order of magnitude higher than the reciprocal of the upper state lifetime of the slave laser gain medium;

wherein:
the spectrum of the optical seeds is stable and covers one or more longitudinal modes of the slave laser;

wherein:
the emission spectrum of the solid-state gain medium covers 800-nm and below;

whereby DUV laser with a wavelength of 200 nm or below is produced via a harmonic generation of fourth order or lower;

whereby the cavity length of the slave laser oscillator is not actively controlled.

14. An all-solid-state laser system that produces coherent DUV light as of claim 13 further comprising:
one or more thermoelectric controller(s) affixed to the seed laser and the slave laser solid-state gain medium for active temperature control.

15. An all-solid-state laser system that produces coherent DUV light as of claim 13 wherein:
said seed laser produces optical seeds with swept wavelength around 772 nm;
the slave laser solid-state gain medium is Ti:Sapphire;
said pump light source operates at a pulsed mode with pulse width around 3 µs,
wherein the peak power of the pump light source is enhanced at a given average value;
whereby laser output at wavelength around 193 nm is generated via fourth order harmonic generation.

16. An all-solid-state laser system that produces coherent DUV light as of claim 13 wherein:
said seed laser produces optical seeds with a wavelength between 570 nm and 600 nm;
the slave laser solid-state gain medium is a solid-state material doped with Rhodamine 6G;
whereby laser output at wavelength between 190-200 nm is generated via frequency tripling.

* * * * *